(12) United States Patent
Lee et al.

(10) Patent No.: US 11,062,984 B2
(45) Date of Patent: Jul. 13, 2021

(54) METHODS FOR FORMING SEMICONDUCTOR DEVICES

(71) Applicant: Micron Technology, Inc., Boise, ID (US)

(72) Inventors: Tzung-Han Lee, Taipei (TW); Yaw-Wen Hu, Taoyuan (TW); Neng-Tai Shih, New Taipei (TW); Hsu Chiang, New Taipei (TW); Hsin-Chuan Tsai, Taoyuan (TW); Sheng-Hsiung Wu, Taipei (TW)

(73) Assignee: Micron Technology, Inc., Boise, ID (US)

( * ) Notice: Subject to any disclaimer, the term of this patent is extended or adjusted under 35 U.S.C. 154(b) by 271 days.

(21) Appl. No.: 16/177,891

(22) Filed: Nov. 1, 2018

(65) Prior Publication Data

US 2019/0074246 A1    Mar. 7, 2019

Related U.S. Application Data

(62) Division of application No. 15/001,255, filed on Jan. 20, 2016, now Pat. No. 10,121,734.

(51) Int. Cl.
*H01K 3/10* (2006.01)
*H01L 23/498* (2006.01)
(Continued)

(52) U.S. Cl.
CPC ...... *H01L 23/49822* (2013.01); *H01L 21/486* (2013.01); *H01L 21/4857* (2013.01);
(Continued)

(58) Field of Classification Search
CPC .......... H01L 23/49822; H01L 21/4857; H01L 21/486; H01L 23/49827; H01L 3/49838;
(Continued)

(56) References Cited

U.S. PATENT DOCUMENTS 6,162,997 A    12/2000 Memis
6,703,704 B1    3/2004 Alcoe et al.
(Continued)

FOREIGN PATENT DOCUMENTS

TW    200843061 A    11/2008

OTHER PUBLICATIONS

Taiwanese Office Action and Search Report for Taiwanese Application No. 107146371, dated Oct. 1, 2019, 16 pages.
(Continued)

*Primary Examiner* — Donghai D Nguyen
(74) *Attorney, Agent, or Firm* — TraskBritt

(57) ABSTRACT

A semiconductor device includes a substrate, and interposer layers. The substrate has a first region, and a second region adjacent the first region. The interposer layers are sequentially stacked on the substrate. Each of the interposer layers has an active region and an open region, are respectively correspond to the first region and the second region of the substrate. Each of the interposer layers includes a device layout pattern, and a stress release structure. The device layout pattern is formed within the active region. The stress release structure is formed within the open region, and includes openings.

19 Claims, 6 Drawing Sheets

(51) Int. Cl.
 *H01L 21/48* (2006.01)
 *H01L 23/00* (2006.01)
(52) U.S. Cl.
 CPC .. *H01L 23/49827* (2013.01); *H01L 23/49838* (2013.01); *H01L 23/49894* (2013.01); *H01L 23/562* (2013.01); *H01L 2924/3511* (2013.01)
(58) Field of Classification Search
 CPC ............ H01L 23/49894; H01L 23/562; H01L 2924/3511; Y10T 29/49155; Y10T 29/49165
 USPC .......................................... 29/830, 846, 852
 See application file for complete search history.

(56) References Cited

U.S. PATENT DOCUMENTS

| | | | |
|---|---|---|---|
| 7,763,965 | B2 | 7/2010 | Webb |
| 8,519,528 | B1 | 8/2013 | Nagarajan et al. |
| 8,756,560 | B2 | 6/2014 | Takada |
| 9,305,877 | B1 * | 4/2016 | Yu ....................... H01L 23/3107 |
| 2006/0024921 | A1 | 2/2006 | Huang |
| 2010/0171226 | A1 | 7/2010 | West et al. |
| 2013/0292830 | A1 | 11/2013 | Liang et al. |
| 2014/0042640 | A1 | 2/2014 | Tsai et al. |
| 2014/0157593 | A1 | 6/2014 | Lin et al. |
| 2014/0291001 | A1 | 10/2014 | Lin et al. |
| 2015/0028482 | A1 | 1/2015 | Ming et al. |

OTHER PUBLICATIONS

Taiwanese Office Action and Search Report for Taiwanese Application No. 105125199, dated Dec. 19, 12 pages including English translation.

* cited by examiner

METHODS FOR FORMING SEMICONDUCTOR DEVICES

CROSS-REFERENCE TO RELATED APPLICATION

This application is a divisional of U.S. patent application Ser. No. 15/001,255, filed Jan. 20, 2016, now U.S. Pat. No. 10,121,734, issued Nov. 6, 2018, the disclosure of which is hereby incorporated herein in its entirety by this reference.

TECHNICAL FIELD

The present disclosure relates to a semiconductor device. More particularly, the present disclosure relates to interposer layers of the semiconductor device.

BACKGROUND

Conventional semiconductor devices may be fabricated with interposer layers, such that the interposer layers can function as an insulating layer, insulated device dies, or a conducting layer defining connecting relationships among device dies. The interposer layers function as the conducting layer may include conductive features formed inside substrates of the interposer layers for correspondingly interconnecting among device dies or created wanted terminals, such as printed patterned wires or through silicon vias (TSVs). However, the substrates of the interposer layers would not be fully occupied by device dies disposed in the semiconductor device, as well as, the conductive features formed correspondingly with the device dies. Therefore, the interposer layers may be partitioned into at least two regions, an active region disposed with the device dies and the conductive features, and an open region formed without the device dies or the conductive features, which may lead to different coefficients of expansion in the different regions.

While fabrication processes of forming semiconductor device include processes generating heat accumulated the interposer layers, and arise temperature of the interposer layers. Therefore, variations of the different coefficients of expansion in different regions on the interposer layers may induce unbalance, anisotropic force tensors on the interposer layers, and drag or force the interposer layer to permanent warpage or deformation, especially performed on a boundary region or corner region of the interposer layers. As aforementioned, the available structure of a semiconductor device apparently exists inconvenience and defects, and needs further improvement. To address the problems, the ordinary skilled artisans have been striving to attain a solution, but still not to develop a suitable solution. Therefore, it is important to effectively deal with the problems in the art.

BRIEF SUMMARY

The present disclosure provides a semiconductor device including a substrate and interposer layers. The substrate has a first region and a second region adjacent the first region. The interposer layers are sequentially stacked on the substrate. Each of the interposer layers has an active region and an open region, which are respectively corresponded to the first region and the second region of the substrate. Each of the interposer layers includes a device layout pattern and a stress release structure. The device layout pattern is formed on the active region. The stress release structure is formed on the open region and includes openings.

According to an embodiment of the present disclosure, the semiconductor device further includes a stiffener film. The stiffener film is formed on a surface of one of the interposer layers, facing away from the substrate.

According to an embodiment of the present disclosure, in which the stiffener film includes a material selected from the group consisting of silicon nitride, tantalum, titanium, tantalum nitride, titanium nitride, or the combination thereof.

According to an embodiment of the present disclosure, in which the openings are formed through the corresponding interposer layer.

According to an embodiment of the present disclosure, in which the openings are rectangular- or ellipse-shaped.

According to an embodiment of the present disclosure, in which the openings are arranged in rows and columns.

According to an embodiment of the present disclosure, the semiconductor device further includes a conductive material. The conductive material is formed inside the openings in one of the interposer layers.

According to an embodiment of the present disclosure, in which the first region is enclosed by the second region.

The present disclosure provides a method for sequentially forming interposer layers on a substrate, in which the substrate has a first region and a second region. Each of the interposer layers has an active region and an open region, respectively corresponded to the first region and the second region. The method includes forming a device layout pattern on the active region of each of the interposer layers; and forming a stress release structure on the open region of each of the interposer layers. The stress release structure includes openings.

According to an embodiment of the present disclosure, in which the forming of the stress release structure includes forming the openings through the corresponding interposer layer.

According to an embodiment of the present disclosure, in which the device layout pattern and the stress release structure are formed by using a single mask at the same time.

According to an embodiment of the present disclosure, in which the forming of the device layout pattern includes a damascene process or a through silicon via (TSV) process.

According to an embodiment of the present disclosure, the method further includes forming a conductive material inside the openings.

According to an embodiment of the present disclosure, the method further includes forming a stiffener film on a surface of one of the interposer layers facing away from the substrate.

According to an embodiment of the present disclosure, in which the opening can be formed as a rectangle or an ellipse.

According to an embodiment of the present disclosure, in which the first region is enclosed by the second region.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
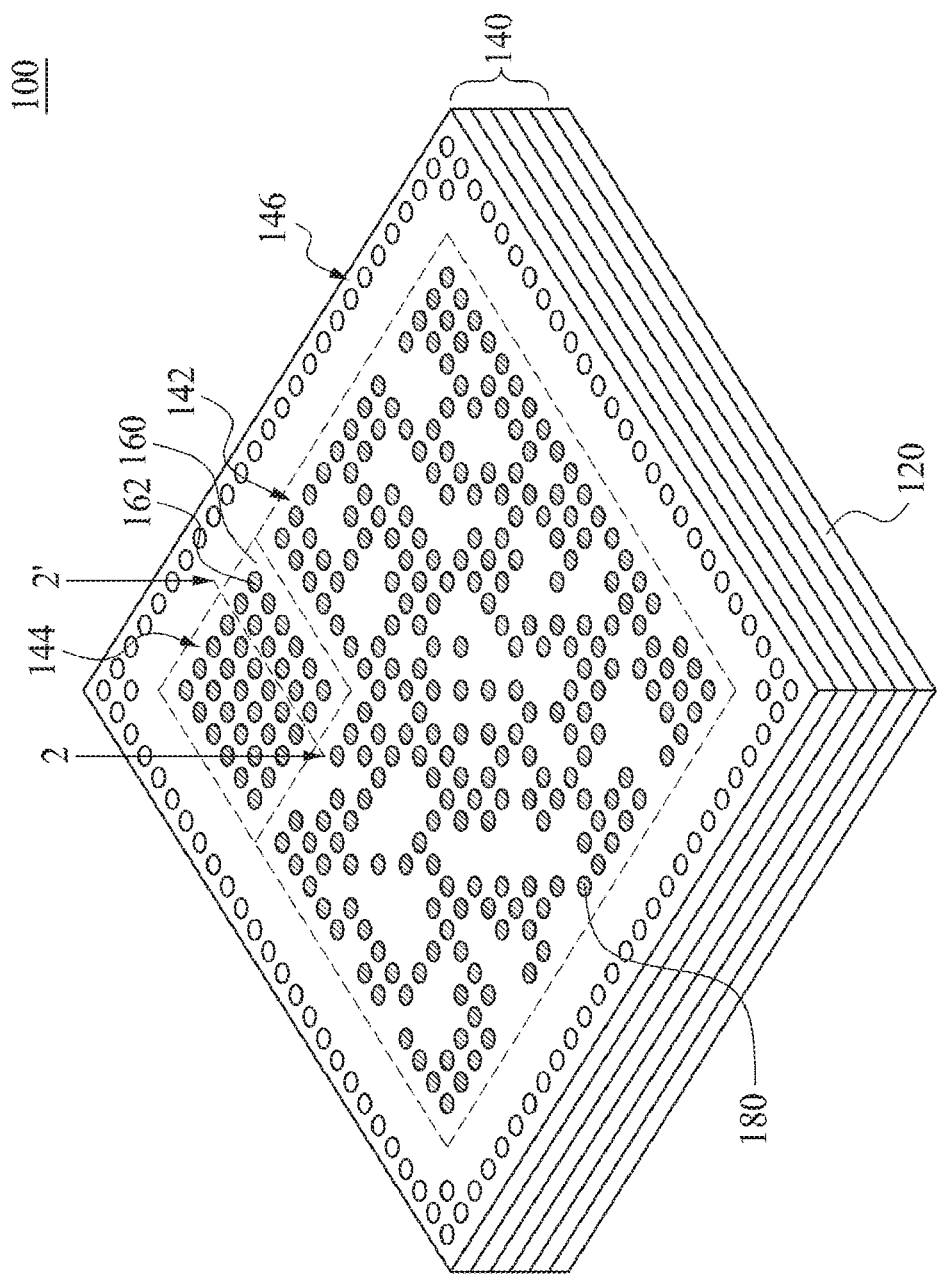
FIG. 1 is a schematically perspective view of a semiconductor device according to different embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

It will be understood that when an element is referred to as being "on" another element, it can be directly on the other element or intervening elements may be present therebetween. In contrast, when an element is referred to as being "directly on" another element, there are no intervening elements present.

FIG. 1 illustrates a schematically perspective view of a semiconductor device 100 according to different embodiments of the present disclosure. As shown in FIG. 1, the semiconductor device 100 may include a substrate 120 and interposer layers 140. The interposer layers 140 are sequentially stacked on the substrate 120. Each of the interposer layers 140 has an active region 142 and an open region 144, which are respectively corresponded to a first region and a second region of the substrate 120. That is to say, the first region and the second region of the substrate 120, described herein, may represent an area overlapped with vertical projection of the active region 142 and an area overlapped with vertical projection of the open region 144 on the substrate 120 along a stacking direction A of the interposer layers 140, respectively. Accordingly, the substrate 120 has the first region, and the second region adjacent the first region. In some embodiments, the substrate 120 may have first regions, and at least one second region adjacent the first regions. Each of the interposer layers 140 may include a device layout pattern 180 and a stress release structure 160. It should be noted that, the active region 142 and the open region 144, drawn herein, is only exemplary, and could be adjusted to actual demand by those skilled in the art, without departing from the scope or the spirits of the present disclosure. The device layout pattern 180 is formed within the active region 142. The device layout pattern 180, described herein, may be conductive features formed inside the interposer layers 140, such as a patterned conductive route 182A or through silicon vias (TSVs) 182B, for example, which would be described later in FIGS. 4A and 4B. The stress release structure 160 is formed within the open region 144, in which the stress release structure 160 has openings 162.

Owing to the stress release structure 160 formed within the open region 144 may generate a structure similarly to device layout pattern 180 formed in the active region 142, such that the variation between the coefficient of expansion in the open region 144 of the interposer layers 140 and the coefficient of expansion in the active region 142 of the interposer layers 140 can be reduced. Therefore, the semiconductor devices 100 fabricated under heating process may avoid or reduce unbalance force tensor generated by variation of the expansions between the active region 142 and the open region 144 of the interposer layers 140 for inducing permanent warpage or deformation on the interposer layers 140. In addition, the stress release structure 160 can also provide greater support and resistance against the remained unbalance force tensor deformed the interposer layers 140, comparing to featureless open region.

Figure 2:
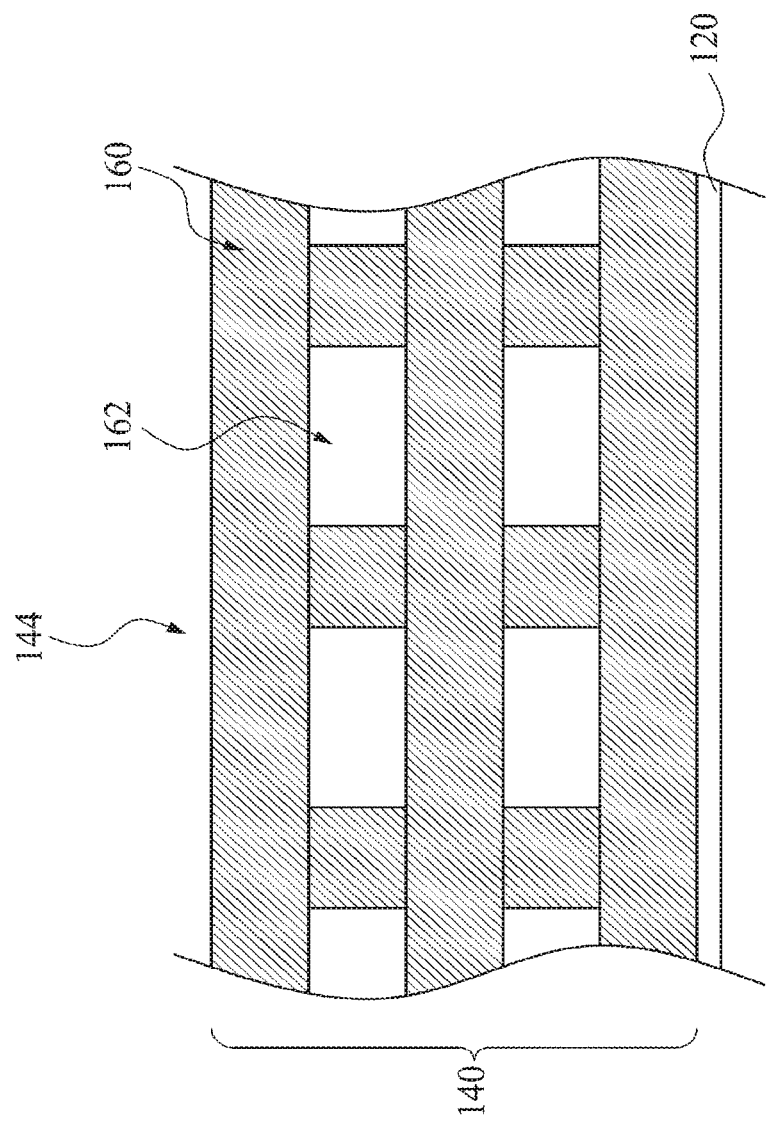
FIG. 2 is a longitudinal sectional view of a stress release structure of the semiconductor device according to different embodiments of the present disclosure.

FIG. 2 illustrates a longitudinal sectional view of a stress release structure 160 of a semiconductor device 100 formed within an open region 144 according to different embodiments of the present disclosure. In some embodiments, each of the openings 162 can be formed through the corresponding interposer layer 140. In some embodiments, each of the openings 162 may be formed partially through the corresponding interposer layer 140. Therefore, the stress release structure 160 may provide support and resistance against the force along a direction substantially parallel to surfaces of the interposer layers 140, as well as, a direction of the force induced by the expansion variation between different regions of the interposer layers 140, such as the active region 142 and the open region 144, so that the stress release structure 160 can reduce or avoid warpage and deformation on the interposer layers 140 to some degree.

Figure 3B:
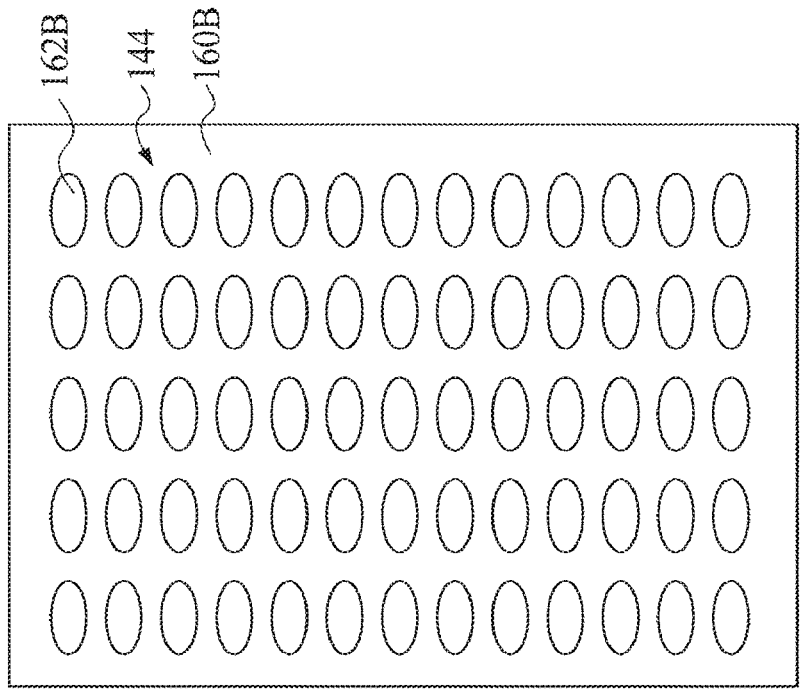
FIGS. 3A and 3B are schematic top views of a stress release structure of the semiconductor device formed within an open area according to various embodiments of the present disclosure.
Figure 3A:
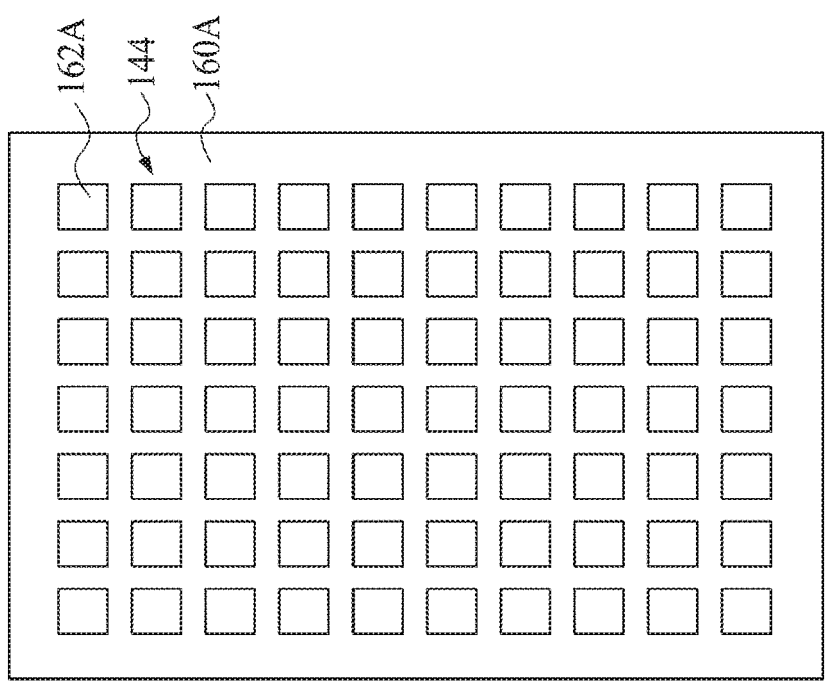

FIGS. 3A and 3B respectively illustrate schematically top views of a stress release structure 160A and a stress release structure 160B of the semiconductor device 100, formed within an open region 144 according to various embodiments of the present disclosure. Referring to the FIG. 3A, in some embodiments, the openings 162A are formed as a rectangle. Referring to the FIG. 3B, in some embodiments, the openings 162B are formed as an ellipse or a circle. In some embodiments, the openings 162A or the openings 162B can be arranged in rows and columns. In some embodiments, the openings 162A or the openings 162B may be formed along a direction substantially parallel to a boundary of the open region 144. In some embodiments, the openings 162A or the openings 162B may be formed along a direction unparallel to the boundary of the open region 144. In some embodiments, the semiconductor device 100 may further include a conductive material. The conductive material can be formed inside the openings 162 in the interposer layers 140, such that the stress release structure 160 can be reinforced and further reduce the variation of the expansions between the active region 142 and the open region 144.

It should be noted that, the formation of openings 162A or the openings 162B on the open region 144, described herein, such as shaped, formed throughout, formed partially through, density, or formation direction, is only exemplary, and not intended to limit the present disclosure. It should be understood that the forming of the openings 162 could be adjusted to actual demand by those skilled in the art, without departed from the scope or the spirits of the present disclosure.

Figure 4B:
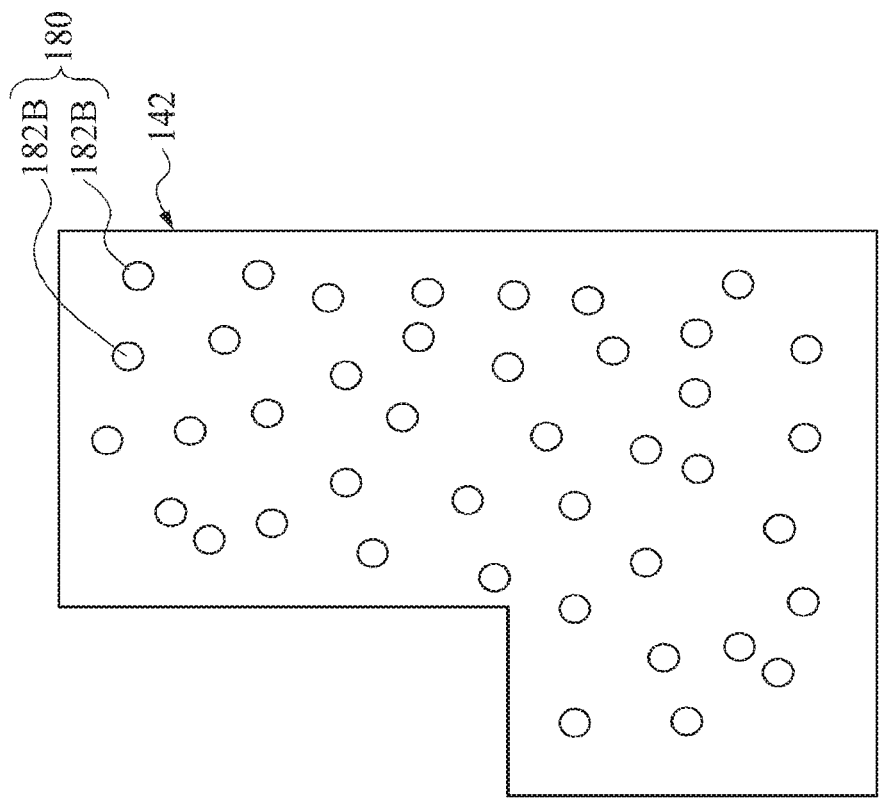
FIGS. 4A and 4B are schematic top views of a device layout pattern of the semiconductor device formed within an active area according to various embodiments of the present disclosure.
Figure 4A:
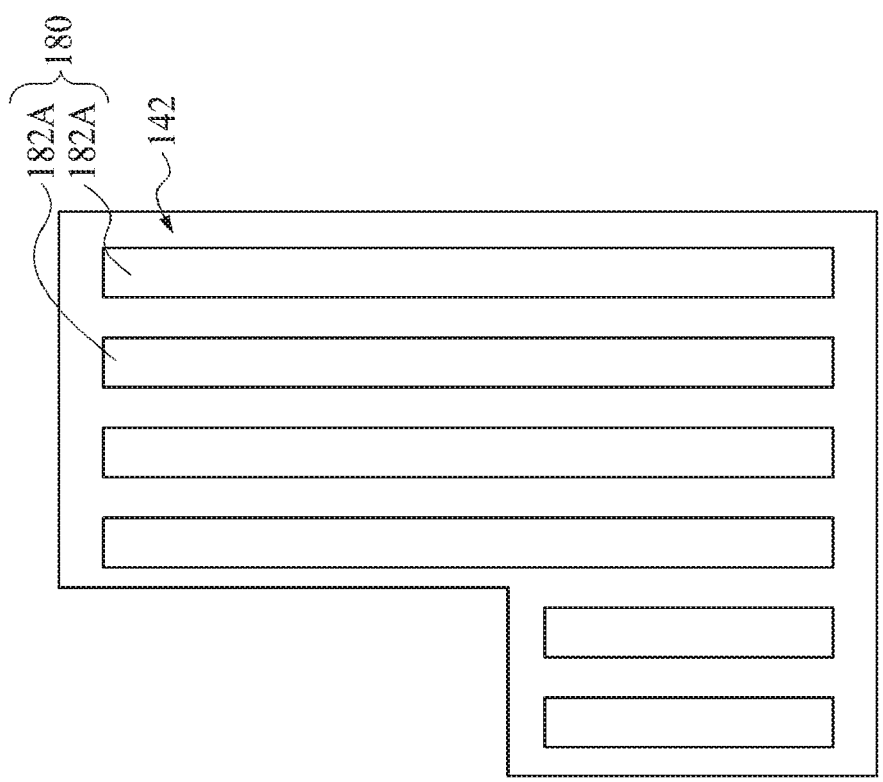

FIGS. 4A and 4B respectively illustrate schematically top views of a device layout pattern 180 of the semiconductor device 100 formed within an active region 142 according to various embodiments of the present disclosure. Referring to FIGS. 4A and 4B, in some embodiments, conductive features of the device layout pattern 180 are formed inside the interposer layers 140 within the active region 142. In some embodiments, the patterned conductive features may include conductive routes 182A. In some embodiments, the patterned conductive features may include through silicon vias (TSVs) 182B.

In some embodiments, the openings 162A and the openings 162B can be respectively formed simultaneously with the conductive routes 182A and the through silicon vias 182B in different interposer layers. Owing to the openings 162A can be defined and formed by mask with parallel straight line, the openings 162A may be formed simultaneously with the conductive routes 182A in a single mask or single process on an interposer layer 140. In addition, owing to the openings 162B can be defined and formed by mask with ellipse shaped, the openings 162B may be formed simultaneously with the through silicon vias 182B in a single mask or single process on an interposer layer 140.

It should be noted that, the openings 162A formed simultaneously with the conductive routes 182A or the openings 162B formed simultaneously with the through silicon vias 182B on an interposer layer, described herein, are only exemplary, not intended to limit the present disclosure. In some embodiments, the openings 162A can be formed with the through silicon vias 182B on an interposer layer 140. In some embodiments, the openings 162B can be formed with the conductive routes 182A on an interposer layer 140. It should be understood that, the combination of the openings 162 with the device layout pattern 180 could be adjusted to actual demand by those skilled in the art, without departed from the scope or the spirits of the present disclosure.

Figure 5:
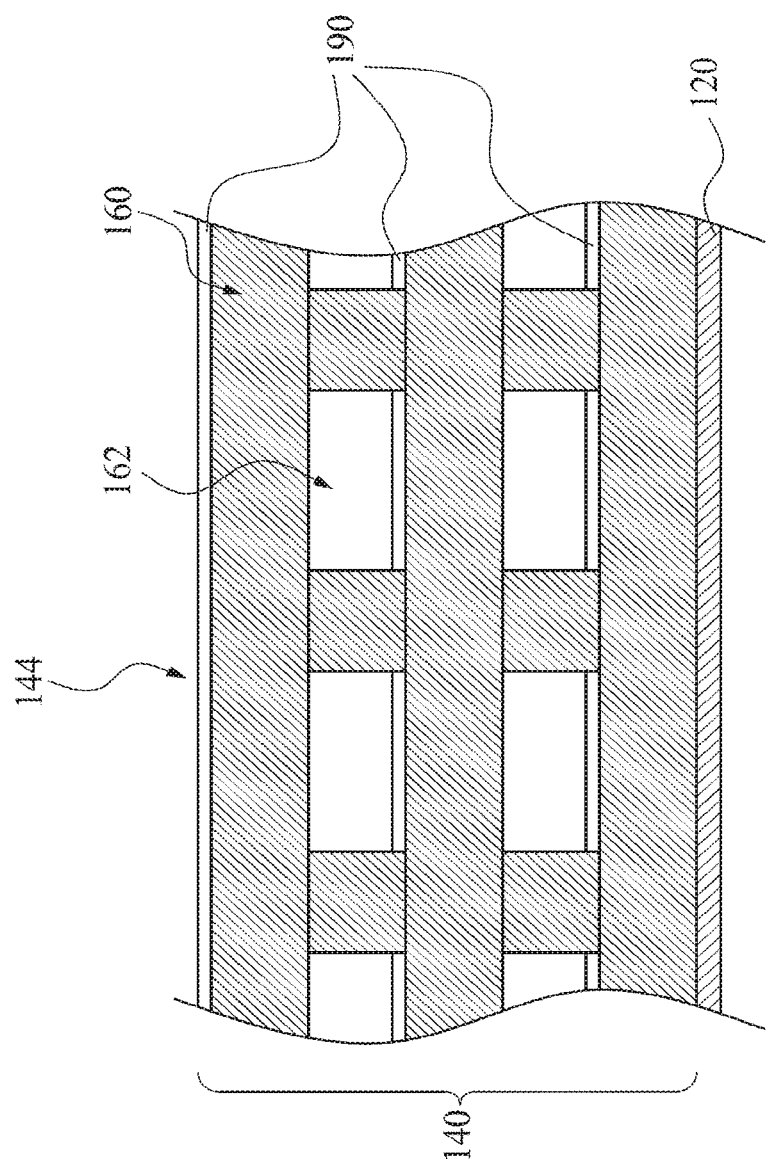
FIG. 5 is a longitudinal sectional view of a stress release structure of the semiconductor device according to different embodiments of the present disclosure.

FIG. 5 illustrates a longitudinal sectional view of a stress release structure 160 of the semiconductor device 100 formed within an open region 144 according to different embodiments of the present disclosure. As shown in FIG. 5, the semiconductor device 100 may further include a stiffener film 190. The stiffener film 190 can be formed on a surface of one of the interposer layers 140 facing away from the substrate 120. In some embodiments, the stiffener film 190 includes a material selected from the group consisting of silicon nitride, tantalum, titanium, tantalum nitride, titanium nitride, other suitable hardness adjustable material, or the combination thereof. Therefore, a hardness or flexibility of the stiffener film 190 can be adjusted to the actual demand, to support and fixed the interposer layer 140 for reducing or avoiding the interposer layer 140 being warpage or deformation.

Referring to FIG. 1, the first region is enclosed by the second region. That is, the second region, described herein, may represent an area overlapped with vertical projection of the open region 144 and a boundary and corner region 146 on the substrate 120 along stacking direction A of the interposer layers 140. On the other hand, the active region 142 may be collectively enclosed by the open region 144 and the boundary and corner region 146. Therefore, the stress release structure 160 formed in the boundary and corner region 146 may provide further enhancement for reducing or avoiding the interposer layers 140 being warpage or deformation, especially in the highly potential region, such as the boundary and corner region 146 of the interposer layers 140.

Figure 6:
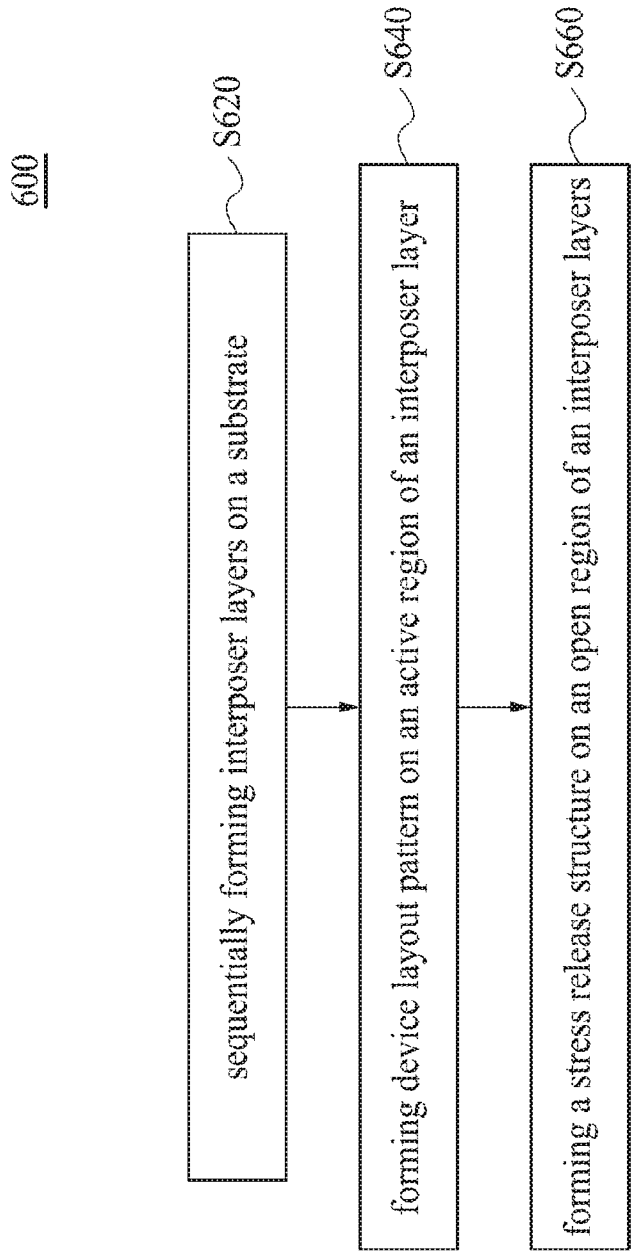
FIG. 6 is a flow chart of a method for sequentially forming interposer layers on a substrate, to fabricate a semiconductor device according to some embodiments of the present disclosure.

FIG. 6 illustrates a flow chart of a method 600 for sequentially forming interposer layers on a substrate, to fabricate a semiconductor device according to some embodiments of the present disclosure. The method 600 begins with step S620 in which interposer layers are sequentially formed on a substrate, in which the substrate has a first region and a second region. Each of the interposer layers has an active region and an open region, respectively corresponded to the first region and the second region. The method 600 continues with step S640 in which a device layout pattern is formed within the active region of each of the interposer layers. The method 600 continues with step S660, in which a stress release structure is formed within the open region of each of the interposer layers, in which the stress release structure includes openings. In some embodiments, step S660 can be operated in advance than step S640. In some embodiments, the step S640 can be operated simultaneously with step S660.

In some embodiments, the forming of the stress release structure includes forming the openings through the corresponding interposer layer. In some embodiments, the forming of the stress release structure includes forming the openings partially through the corresponding interposer layer. In some embodiments, the device layout pattern and the stress release structure are formed by using a single mask at the same time, for saving fabrication time. In some embodiments, the single mask can be a single tone mask. In some embodiments, the single mask can be a halftone, or a multi-tone mask, in which the device layout pattern and the stress release structure can be formed with different depths penetrating the interposer layer.

In some embodiments, the forming of the device layout pattern may include a damascene process, double damascene process, a through silicon via (TSV) process or other suitable conductive feature fabricating process. In some embodiments, the openings can be formed as a rectangle or an ellipse. In some embodiments, the opening formed with the device layout pattern underwent the damascene process can be formed as a rectangular-shaped opening. In some embodiments, the opening formed with the device layout pattern underwent the through silicon via (TSV) process can be formed as an ellipse- or circular-shaped opening. The combination between the device layout pattern and the openings, described herein, are only an example, not intended to limit the present disclosure. For example, the ellipse-shaped openings may be formed under the damascene process. For example, the rectangular-shaped openings may be formed under the through silicon via (TSV) process.

In some embodiments, the method 600 may further continue with a step in which a conductive material is formed inside the openings, so as to eliminate or reduce variation of expansions between the active region and the open region and provide mechanical enhancement within the openings.

In some embodiments, the method 600 may further continue with a step in which a stiffener film is formed on a surface of one of the interposer layers facing away from the substrate. A hardness of the stiffener film can be adjusted to enhance and fixed the interposer layer under heat expansion.

Summarized from the above description, the present disclosure provides a semiconductor device including a substrate, and interposer layers. The substrate has a first region, and a second region adjacent the first region. The interposer layers are sequentially stacked on the substrate. Each of the interposer layers has an active region and an open region, which are respectively corresponded to the first region and the second region of the substrate. Each of the interposer layers includes a device layout pattern, and a stress release structure. The device layout pattern is formed within the active region. The stress release structure is formed within the open region, and includes openings.

Although some embodiments of the present disclosure and their advantages have been described in detail, it should be understood that various changes, substitutions, and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machinery, fabrication, composition of matter, means, methods, and steps described in the specification. As one of ordinary skill in the art will readily appreciate from the disclosure of the present disclosure, processes, machinery, fabrication, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machinery, fabrication, compositions of matter, means, methods, or steps.

What is claimed is:

1. A method comprising:
sequentially forming interposer layers on a substrate, wherein the substrate has a first region and a second region, and each of the interposer layers having an active region and an open region, respectively corresponded to the first region and the second region, sequentially forming interposer layers on a substrate comprising:
forming a device layout pattern on the active region of each of the interposer layers; and
forming a stress release structure on the open region of each of the interposer layers, comprising forming multiple groups of openings, each group of openings comprising multiple openings oriented in a column relative to one another and sharing a longitudinal axis extending in a direction normal to a surface of the substrate upon which the interposer layers are formed,
wherein adjacent openings of each group of openings have at least one interposer layer disposed there between.

2. The method of claim 1, wherein forming a stress release structure comprises forming the openings through the corresponding interposer layer.

3. The method of claim 1, wherein forming a device layout pattern and forming a stress release structure comprises forming the device layout pattern and the stress release structure using a single mask at the same time.

4. The method of claim 1, wherein forming a device layout pattern comprises conducting a damascene process or a through silicon via (TSV) process.

5. The method of claim 1, further comprising forming a conductive material inside the openings.

6. The method of claim 1, further comprising forming a stiffener film on a surface of one of the interposer layers facing away from the substrate.

7. The method of claim 1, wherein the opening is formed as a rectangle or an ellipse.

8. The method of claim 1, wherein the first region is at least partially enclosed by the second region.

9. A method comprising:
sequentially forming interposer layers on a substrate, wherein the substrate has a first region and a second region, and each of the interposer layers having an active region and an open region, respectively corresponded to the first region and the second region, sequentially forming interposer layers on a substrate comprising:
forming a device layout pattern with the active region of each of the interposer layers; and
forming a stress release structure within the open region of each of the interposer layers, forming the stress release structure comprising forming multiple groups of openings in the open region, each group of openings comprising multiple openings oriented in a column relative to one another and sharing a longitudinal axis extending in a direction normal to a surface of the substrate upon which the interposer layers are formed,
wherein each opening of each group of openings extends through only a single interposer layer of the interposer layers.

10. The method of claim 9, wherein forming the stress release structure further comprises forming each group of openings to have material of at least one interposer layer of the interposer layers disposed between adjacent openings within each group of openings.

11. The method of claim 9, further comprising forming a stiffener film on a surface of one of the interposer layers facing away from the substrate.

12. The method of claim 11, wherein forming a stiffener film comprises forming a stiffener film from a material selected from the group consisting of silicon nitride, tantalum, titanium, tantalum nitride, titanium nitride, and combinations thereof.

13. The method of claim 9, wherein forming multiple groups of openings comprises forming each opening of the multiple groups of opening to be vacant.

14. The method of claim 9, wherein forming multiple groups of openings comprises forming each opening of the multiple groups of opening to have a rectangular or elliptical cross-section.

15. The method of claim 9, wherein forming the stress release structure further comprises forming openings of different groups of openings to be oriented in rows relative to one another.

16. The method of claim 9, further comprising disposing conductive material in at least one opening of at least one group of opening.

17. The method of claim 9, further comprising forming the second region to at least partially enclose the first region of substrate.

18. A method comprising:
sequentially forming interposer layers on a substrate, wherein the substrate has a first region and a second region, and each of the interposer layers having an active region and an open region, respectively corresponded to the first region and the second region, sequentially forming interposer layers on a substrate comprising:
forming a device layout pattern with the active region of each of the interposer layers;
forming a stress release structure within the open region of each of the interposer layers, forming the stress release structure comprising:
forming multiple groups of openings in the open region, each group of openings comprising multiple openings oriented in a column relative to one another and sharing a longitudinal axis in a direction normal to a surface of the substrate upon which the interposer layers are formed;

forming each opening of each group of openings to extend through a single interposer layer of the interposer layers; and forming each group of openings to have material of at least one interposer layer of the interposer layers disposed between adjacent openings within each group of openings; and forming a stiffener film on a surface of each interpose layer of the interposer layers facing away from the substrate.

19. The method of claim 18, further comprising disposing conductive material in at least one opening of at least one group of opening.

* * * * *

UNITED STATES PATENT AND TRADEMARK OFFICE
CERTIFICATE OF CORRECTION

PATENT NO. : 11,062,984 B2  
APPLICATION NO. : 16/177891  
DATED : July 13, 2021  
INVENTOR(S) : Tzung-Han Lee et al.

Page 1 of 1

It is certified that error appears in the above-identified patent and that said Letters Patent is hereby corrected as shown below:

In the Claims

Claim 12, Column 8, Line 30, change "claim 11" to --claim 1--

Signed and Sealed this  
Twenty-first Day of September, 2021

Drew Hirshfeld  
*Performing the Functions and Duties of the*  
*Under Secretary of Commerce for Intellectual Property and*  
*Director of the United States Patent and Trademark Office*